(12) United States Patent
Park et al.

(10) Patent No.: US 7,701,312 B2
(45) Date of Patent: Apr. 20, 2010

(54) INTEGRATED DEVICE AND FABRICATING METHOD THEREOF

(75) Inventors: Eun-seok Park, Yongin-si (KR);
Kuang-woo Nam, Suwon-si (KR);
In-sang Song, Seoul (KR); Chul-soo Kim, Hwaseong-si (KR); Yun-Kwon Park, Dongducheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 11/812,878

(22) Filed: Jun. 22, 2007

(65) Prior Publication Data
US 2008/0116999 A1 May 22, 2008

(30) Foreign Application Priority Data
Nov. 16, 2006 (KR) .................... 10-2006-0113303

(51) Int. Cl.
*H03H 9/00* (2006.01)

(52) U.S. Cl. .................... 333/187; 333/186; 333/188
(58) Field of Classification Search ........... 333/187
See application file for complete search history.

(56) References Cited

U.S. PATENT DOCUMENTS 6,204,737 B1* 3/2001 Ella ........................ 333/187

* cited by examiner

*Primary Examiner*—Rexford N Barnie
*Assistant Examiner*—Matthew C Tabler
(74) *Attorney, Agent, or Firm*—NSIP Law

(57) ABSTRACT

An integrated device is constructed by integrating an FBAR and a tunable capacitor. The integrated device includes a substrate; a resonator formed on the substrate; a driving electrode layer formed on the substrate apart from the resonator; a first electrode layer formed upwardly apart from the substrate and facing the resonator; and a second electrode layer formed upwardly apart from the substrate and facing the driving electrode layer, the second electrode layer stepped from the first electrode layer. Accordingly, the integrated device can increase the tuning range and mitigate the parasitic resistance.

10 Claims, 7 Drawing Sheets

FIG. 6

INTEGRATED DEVICE AND FABRICATING METHOD THEREOF

CROSS-REFERENCE TO RELATED APPLICATIONS

This application claims benefit under 35 U.S.C. §119(a) of Korean Patent Application No. 2006-113303, filed on Nov. 16, 2006, in the Korean Intellectual Property Office, the entire disclosure of which is hereby incorporated by reference.

BACKGROUND OF THE INVENTION

1. Field of the Invention

The present invention relates to an integrated device and fabricating method thereof. More particularly, the present invention relates to an integrated device and its fabricating method for increasing a tuning range using a film bulk acoustic resonator (FBAR) and a tunable capacitor integrated together and reducing a parasitic resistance occurring from a discrete connection.

2. Description of the Related Art

Recently, as mobile communication devices, such as cellular phones, are prevalently used, effort has been made to enhance the performance of mobile communication devices and fabricate them to have smaller size and lighter weight. In response, research is conducted to improve the performance of components of the mobile communication device and miniaturize the components with light weight at the same time.

One of the crucial components of the mobile communication device is a duplexer. The duplexer, which is one of representative devices using a filter in a composite manner, adequately separates signals transmitted and received over a single antenna in a frequency division duplex (FDD) communication system, thus enabling the device to share the antenna efficiently.

A basic structure of the duplexer includes a transmit filter and a receive filter besides an antenna. The transmit filter is a band pass filter which passes only signals in a frequency band to be transmitted, and the receive filter is a band pass filter which passes only signals in a frequency band to be received. The duplexer differently regulates frequencies passed through the transmit filter and the receive filter and thus allows transmission and reception on the single antenna.

The transmit filter and the receive filter, forming the basic structure of the duplexer, can employ a film bulk acoustic resonator (FBAR). It is known that the FBAR, which can be implemented with small size and light weight, is the dominant means for configuring a filter suitable for high power. The FBAR can be manufactured with minimum cost in miniature size. Also, the FBAR can realize high Quality Factor (Q) value which is an important property of the filter and can be used in a micro-frequency band. In particular, the FBAR can even implement personal communication system (PCS) band and digital cellular system (DCS) band.

The FBAR is fabricated by depositing a lower electrode, a piezoelectric layer, and an upper electrode in that order, to generate resonance when an external electric field is applied. Specifically, when the time-variant electric field is induced by applying electric energy to the upper and lower electrodes of the FBAR, the piezoelectric layer generates the piezoelectric effect which transforms the electric energy to an acoustic mechanical energy to thus generate the resonance. Since the FBAR passes only signals in a specific band based on the resonant frequency, it functions as a band pass filter.

In the mean time, as communication devices become miniaturized and complicated, there has been a demand for small terminals capable of using multiple frequency bands. To use multiple frequency bands at one terminal, a filter bank using multiple filters can be employed. However, the filter bank hinders the recent trend toward size reduction. To avoid this problem, a tunable filter is adopted. The filter bank can be replaced by one or two tunable filters of which the frequency changes by about 30% because of the voltage. A microelectromechanical systems (MEMS) resonator capable of tuning enables the implementation of a tunable filter. It is a FBAR using bulk resonance characteristics that shows good characteristics in the 2~5 GHz band with the smallest size up to now. Also, since the FBAR is low-priced and uses a silicon substrate having integration compatibility with an IC, it is easy to integrate with a MEMS tunable L/C for frequency tuning.

Figure 1A:
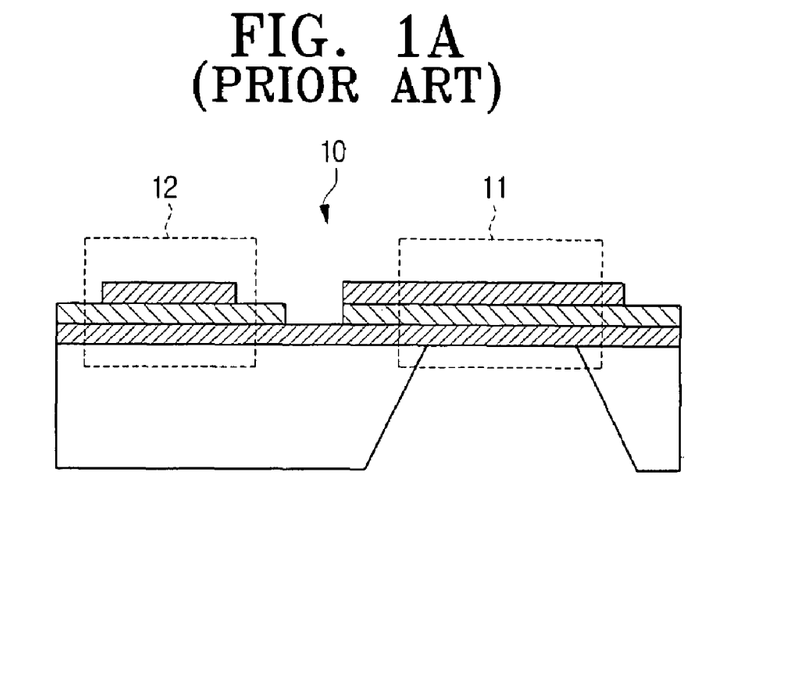
FIGS. 1A and 1B depict the conventional art.
Figure 1B:
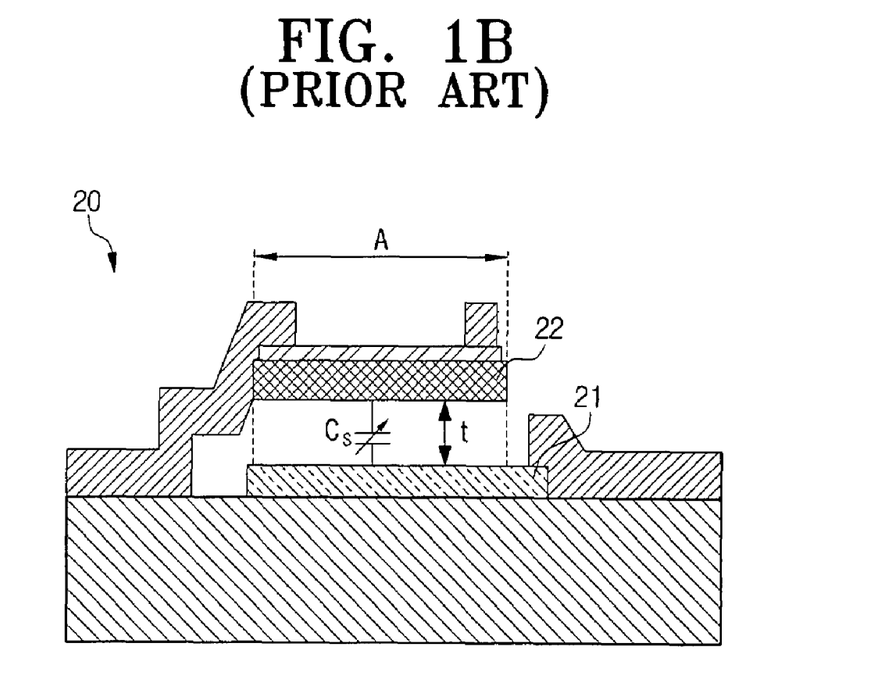

FIGS. 1A and 1B depict a conventional tunable FBAR.

FIG. 1A shows a structure 10 in which a tunable device and a FBAR are linked to each other. Since the FBAR 11 and the tunable capacitor 12 are not integrated but discretely connected, parasitic resistance may occur and there is a limit to the miniaturization.

FIG. 1B shows a structure 20 in which a tunable capacitor and a FBAR are integrated together. The capacitance is varied by vertically moving the FBAR 22 which is fixed in the cantilever structure. In this situation, disadvantageously, the tuning rate is limited to 1:1.5 due to the pull-in effect and the FBAR characteristics (Q value) are subject to variation because the FBAR 22 moves as a whole.

SUMMARY OF THE INVENTION

Embodiments of the present invention are provided to address the above-mentioned and other problems and disadvantages occurring in the conventional arrangement, and an aspect of the present invention is to provide an integrated device and its fabricating method to increase a tuning range and lower a parasitic resistance by virtue of an FBAR and a tunable capacitor which are integrated together.

According to an aspect of the present invention, there is provided an integrated device which includes a substrate; a resonator formed on the substrate; a driving electrode layer formed on the substrate apart from the resonator; a first electrode layer formed upwardly apart from the substrate and facing the resonator; and a second electrode layer formed upwardly apart from the substrate and facing the driving electrode layer, the second electrode layer stepped from the first electrode layer.

The first electrode layer may be movable toward the resonator by a potential difference generated between the second electrode layer and the driving electrode layer.

The first electrode layer and the second electrode layer may be integrally formed, and the first electrode layer may be bendable toward the resonator by a potential difference generated between the second electrode layer and the driving electrode layer.

The second electrode layer may be formed above the first electrode layer based on the substrate surface and stepped from the first electrode layer.

The integrated device may further include an upper substrate which supports the first electrode layer and the second electrode layer, and shifts the first electrode layer toward the resonator when a potential difference over a certain magnitude is generated between the second electrode layer and the driving electrode layer.

The upper substrate may include a supporter for supporting the first electrode layer and the second electrode layer; a connector for connecting with the substrate; and a hinge for interconnecting the connector to the support to shake the supporter.

The supporter may include a first portion which supports the first electrode layer, and a second portion which is depressed from a surface to support the second electrode layer.

The driving electrode layer may include a first driving electrode layer disposed in one side based on the resonator; and a second driving electrode layer disposed in the other side based on the resonator.

The resonator may include a cavity formed in the substrate; a lower electrode layer formed on the cavity; a piezoelectric layer formed on the lower electrode layer; and an upper electrode layer formed on the piezoelectric layer.

A distance h between the first electrode layer and the substrate surface may be smaller than one third of a distance h2 between the second electrode layer and the substrate surface.

According to the aspect of the present invention, an integrated device fabricating method includes (a) forming a resonator and a driving electrode layer on a first substrate; (b) forming a first electrode layer and a second electrode layer on a second substrate, the second electrode layer stepped from the first electrode layer; and (c) connecting the first substrate and the second substrate such that the first electrode layer faces the resonator and the second electrode layer faces the driving electrode layer.

The operation (a) may include forming a lower electrode layer, the driving electrode layer, and a bonding layer by depositing and patterning a conductive material on the first substrate; and fabricating the resonator by forming a cavity by sequentially depositing a piezoelectric layer and an upper electrode layer on the lower electrode layer and etching a first substrate portion under the lower electrode layer.

The operation (b) may include (b1) forming a supporter which supports the second electrode layer and a connector which connects to the first substrate by etching a surface of the second substrate in a certain pattern; (b2) forming the first electrode layer and the second electrode layer within the supporter; and (b3) forming a hinge which shakily supports the supporter by patterning a portion between the supporter and the connector in a certain form.

The operation (b1) may include first etching the second substrate surface; and forming a first depression and a second depression with different depths by secondly etching a second substrate portion including the first etched portion.

The operation (b2) may form the first electrode layer in the first depression having the greater depth and form the second electrode layer in the second depression by depositing and patterning a conductive material on the second substrate surface which covers the first and second depressions.

BRIEF DESCRIPTION OF THE DRAWING FIGURES

These and/or other aspects of the present invention will become more apparent and more readily appreciated from the following description of exemplary embodiments thereof, with reference to the accompanying drawings, in which.

Throughout the drawings, like reference numbers will be understood to refer to like elements, features and structures.

DETAILED DESCRIPTION OF EXEMPLARY EMBODIMENTS

Certain exemplary embodiments of the present invention will now be described in greater detail with reference to the accompanying drawings.

The matters defined in the following description, such as a detailed construction and element descriptions, are provided as examples to assist in a comprehensive understanding of the invention. Also, descriptions of well-known functions or constructions are omitted for clarity and conciseness.

Figure 2:
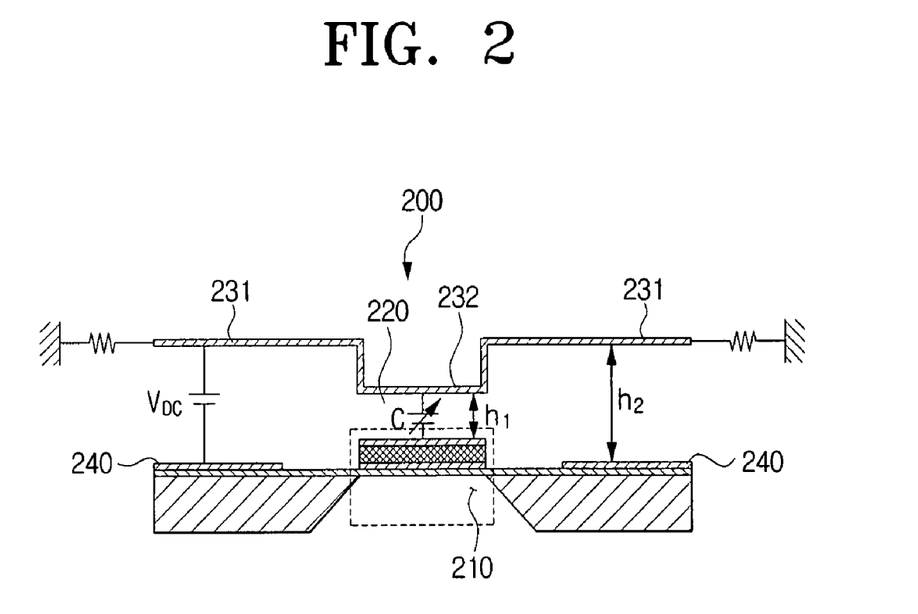
FIG. 2 is a conceptual diagram of an integrated device according to an embodiment of the present invention.

FIG. 2 is a conceptual diagram of an integrated device according to an embodiment of the present invention. Referring to FIG. 2, the integrated device 200 includes a resonator 210 and a tunable capacitor 220 which are integrated together. The tunable capacitor 220 is formed between the resonator 210 and a first electrode 232 which is disposed above the resonator 210. In more detail, as a potential difference V is generated between a driving electrode 240 and a second electrode 231 which is disposed above the driving electrode 240, the first electrode 232 moves toward the resonator 210 and thus changes a distance h2 between the resonator 210 and the first electrode 232 above the resonator 210. Hence, the distance h1 and the capacitance C changes.

Figure 3:
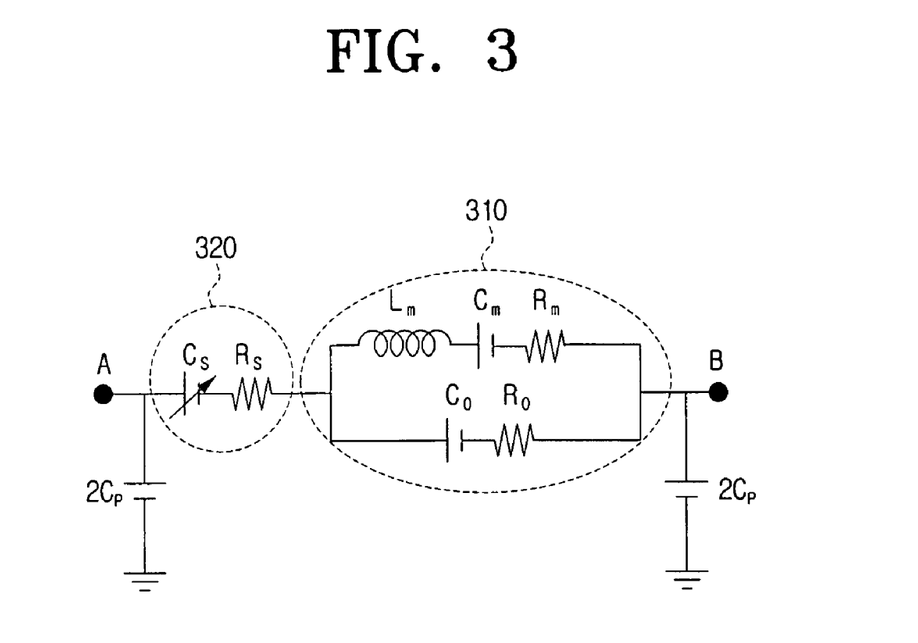
FIG. 3 is a conceptual diagram of an equivalent circuit model of the integrated device of FIG. 2.

FIG. 3 is a conceptual diagram of an equivalent circuit model of the integrated device of FIG. 2. In FIG. 3, a resonator 310 and a tunable capacitor 320 are integrated to configure a circuit structure.

Figure 4:
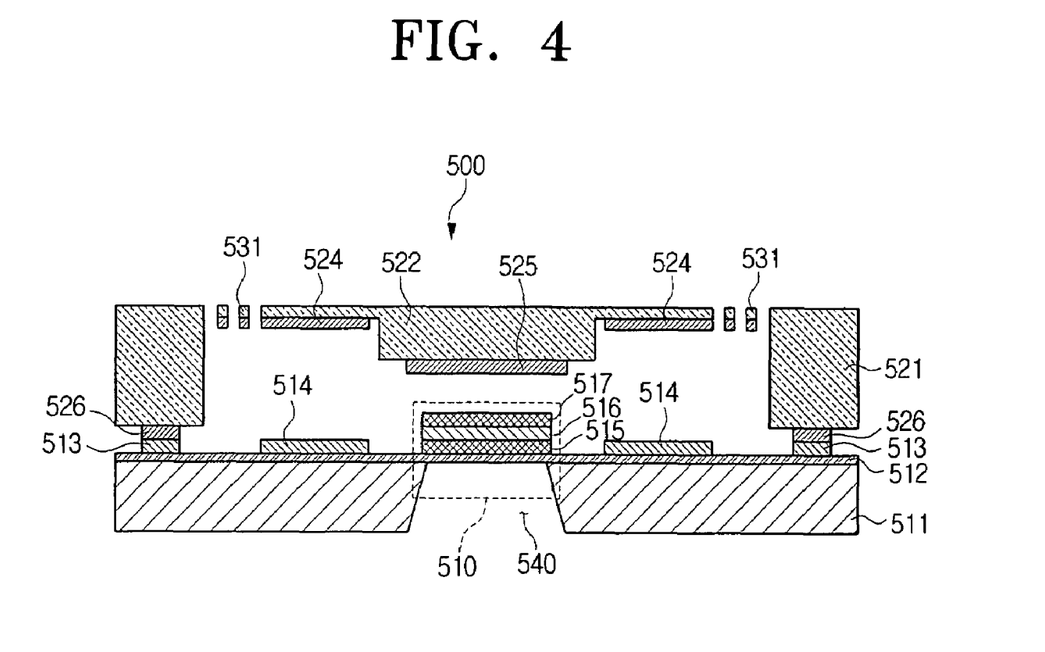
FIG. 4 is a cross sectional view of an integrated device according to an embodiment of the present invention.

FIG. 4 is a cross sectional view of an integrated device 500 according to an embodiment of the present invention. Referring to FIG. 4, a resonator 510 is formed in a certain area of a substrate 511. A driving electrode layer 514 is formed away from each side of the resonator 510. A first electrode layer 525 is formed opposite to the substrate 511 while corresponding to the resonator 510. A second electrode layer 524, opposite to the substrate 511, is stepped from the first electrode layer 525 at positions corresponding to the driving electrode layer 514.

The resonator 510 is formed by depositing a cavity 540 in the substrate 511, a lower electrode layer 515, a piezoelectric layer 516, and an upper electrode layer 517 in that order. The resonator 510 is the portion where the resonance is generated from the piezoelectric effect at the piezoelectric layer 516 when an external electric field is applied to the upper electrode layer 517 and the lower electrode layer 515. Herein, the piezoelectric effect generates a voltage in the piezoelectric layer 516 when a mechanical stress is applied from the outside of the piezoelectric layer 516. The resonance effect generates the resonance over a certain frequency band and blocks other frequencies depending on the thickness of the piezoelectric layer 516, the distance between the two electrode layers 515 and 517, and the type of the piezoelectric layer 516.

The first electrode layer 525 can shift toward the resonator 510 due to the potential difference generating between the second electrode layer 524 and the driving electrode layer 514. In this case, the potential difference can be generated by applying a direct current (DC) voltage between the driving electrode layer 514 and the second electrode layer 524.

The second electrode layer 524 can be formed above the first electrode layer 525 based on the substrate 511 to step from the first electrode layer 525.

The second electrode layer 524 functions as an electrode of the tunable capacitor together with the upper electrode layer 517 of the resonator 510. The air between the second electrode layer 524 and the upper electrode layer 517 of the resonator 510 functions as a dielectric. Given the area A of the second electrode layer 524 and the upper electrode layer 517 of the resonator 510, the distance d between the two electrodes, and the permittivity $\in$ of the air between the two electrodes, the capacitance C can be calculated based on $C=\in \cdot A/d$. Hence, when the second electrode layer 524 shifts toward the upper electrode layer 517 of the resonator 510, the distance d between the two electrodes changes and thus the capacitance C also changes.

It is preferred that a distance h1 between the first electrode layer 525 and the upper electrode of the resonator 510 is smaller than one third of a distance h2 between the second electrode layer 524 and the driving electrode layer 514. In more detail, given the moving distance h of a supporter 522 toward the substrate 511, when h is smaller than h2/3, the first electrode layer 525 shifts up to the upper electrode layer 517 of the resonator 510. Thus, the tuning range may be infinite. When h1 is equal to h2/3, h shifts toward the substrate 511 by h2/3. In this case, if the pull-in effect occurs (the first electrode layer 525 comes down to the upper electrode layer 517 of the resonator 510), the thickness of the upper electrode layer 517 of the resonator 510 becomes great (both the first electrode layer 525 and the upper electrode layer 517 serve as the upper electrode of the resonator 510) and thus the characteristics of the FBAR are retained. Therefore, it is possible to overcome the loss of the FBAR characteristics due to the pull-in effect in the related art of FIG. 1B.

While the first electrode layer 525 and the second electrode layer 524 are separately formed in the above described embodiment of the present invention, they can be integrally formed in some cases. In this case, the first electrode layer 525 may bend toward the resonator 510 by the potential difference between the second electrode layer 524 and the driving electrode layer 514.

An upper substrate supports the first electrode layer 525 and the second electrode layer 524 and moves the first electrode layer 525 to the resonator 510 when the potential difference over a certain magnitude is generated between the second electrode layer 524 and the driving electrode layer 514.

The upper substrate can include a connector 521, a supporter 522, and a hinge 531. The connector 521 serves to connect the supporter 522 and the hinge 531 to the substrate 511. The connector 521 can contact with the substrate 511 by bonding a first bonder 513 formed in the fabrication of the substrate 511 with a second bonder 526 formed in the fabrication of the upper substrate.

The supporter 522 serves to support the first electrode layer 525 and the second electrode layer 524. The supporter 522 can include a first portion which supports the first electrode layer 525 and a second portion which is depressed from the surface to support the second electrode layer 524.

The hinge 531 is shaped in a spring form to interconnect the connector 521 and the supporter 522 so that the support 522 can shake.

FIGS. 5A through 5J are process flow diagrams of the fabricating method of the integrated device of FIG. 4.

Figure 5A:
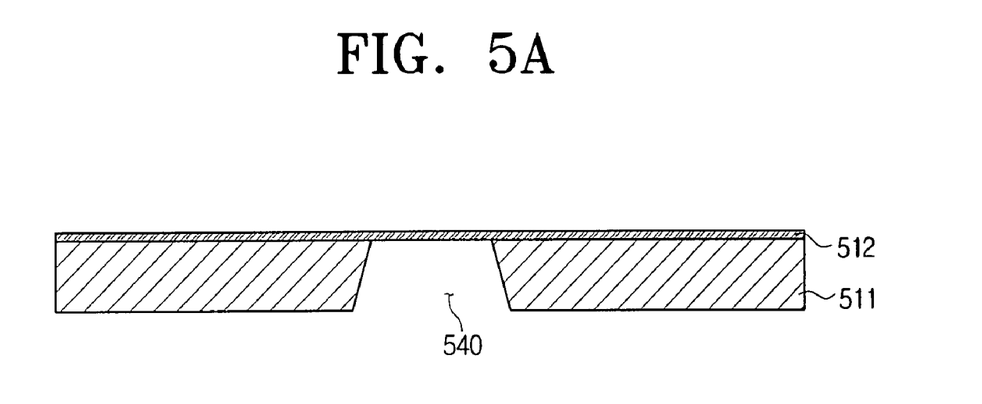
FIGS. 5A through 5J are process flow diagrams of the fabricating method of the integrated device of FIG. 4.

Referring first to FIG. 5A, a silicon dioxide film 512 is deposited on the first substrate 511 in the thickness of 20~30 µm. The silicon dioxide film 512 is used as a temperature compensating film for avoiding frequency shift and loss of an elastic acoustic wave device according to the temperature variation, in addition to the upper plate of the post for holding the elastic acoustic wave device and the cavity realization in the implementation of the elastic acoustic wave device. The temperature compensating film can use silicon nitride (SiN) or magnetic thin film, besides the silicon dioxide film.

Next, a photosensitive film pattern (not shown) is formed under the first substrate 511. The lower surface of the first substrate 511 is etched using a buffered oxide etchant (BOE) with the photosensitive film pattern (not shown) as an etching mask. In doing so, the etching is carried out until the surface of the silicon dioxide film 512 is exposed, to thus form the cavity 540.

Figure 5B:
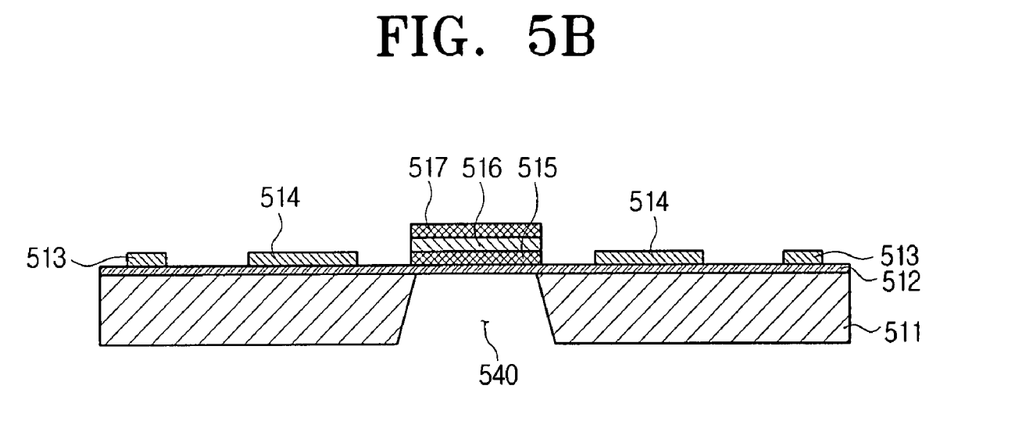

As shown in FIG. 5B, a conductive material is deposited on the silicon dioxide film 512 and patterned to form the lower electrode layer 515, the driving electrode layer 514, and the first bonding layer 513. The conductive material can be deposited using DC sputtering, evaporation, and chemical vapor deposition (CVD), and can be patterned using wet etching, dry etching, and lift-off methods. The conductive material can be aluminum (AL), tungsten (W), gold (Au), platinum (Pt), molybdenum (Mo), and so forth.

Next, the piezoelectric layer 516 and the second electrode layer 517 are deposited and patterned on the lower electrode layer 515. The fabrication of the resonator 510 is well-known in the art and will not be discussed further.

Figure 5C:
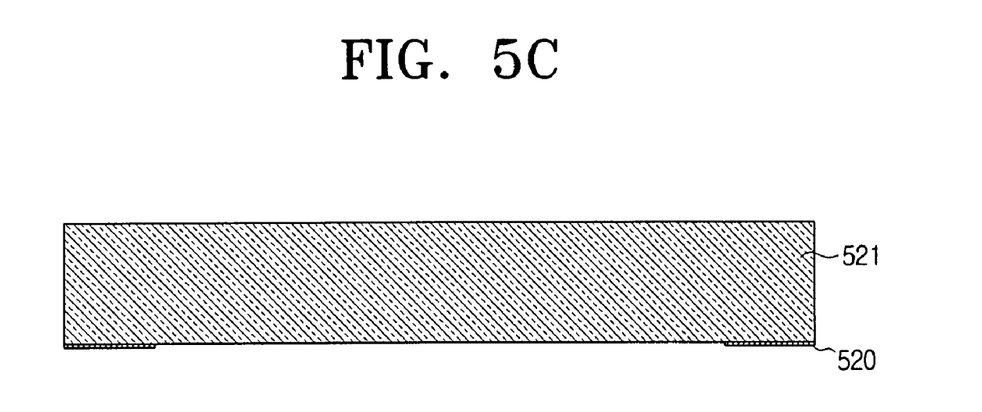

In FIG. 5C, an oxide layer 520 is deposited and patterned in the lower surface of the second substrate 521 to form a portion where the connector will be formed.

Figure 5D:
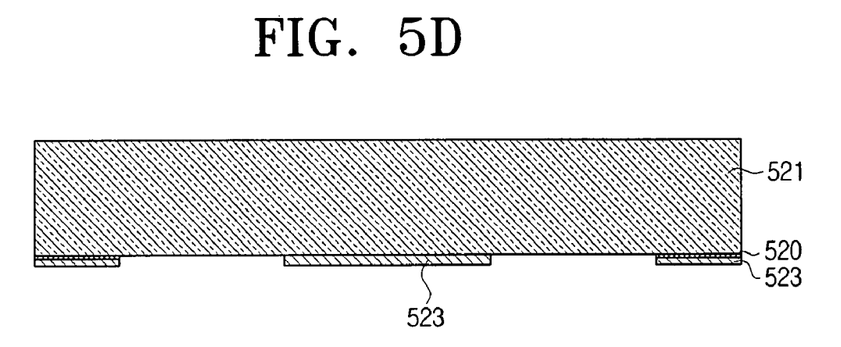

In FIG. 5D, the oxide layer 520 and the second substrate 521 are photo register (PR)-coated and patterned 523 to form a portion where the supporter and the connector will be formed to support the first electrode layer and the second electrode layer.

Figure 5E:
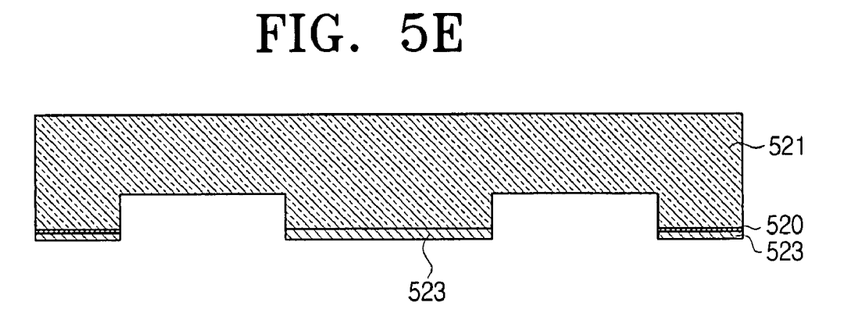

In FIG. 5E, by performing the first etching along the PR coating pattern 523 in the surface of the second substrate 521, the supporter for supporting the first electrode layer and the second electrode layer and the connector for connecting with the first substrate 511 are formed.

Figure 5F:
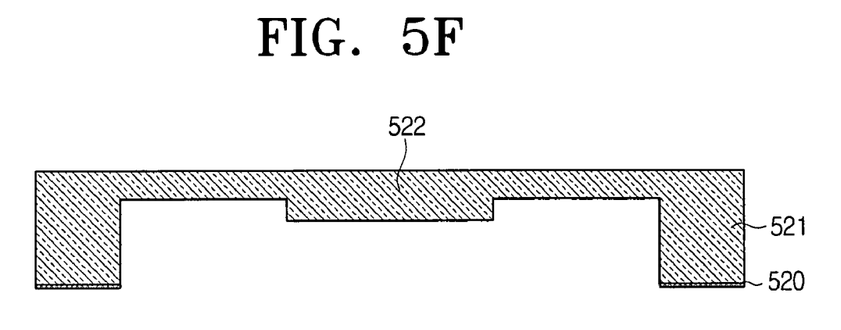

In FIG. 5F, the PR coating 523 is eliminated from the upper surface of the second substrate 521, 522 and the second substrate 521, 522 including the first etching portion is secondly etched to differ the depression depth. In doing so, it is preferred that the depth of the first depression where the first electrode layer will be formed is greater than the depth of the second depression where the second electrode layer will be formed.

Figure 5G:
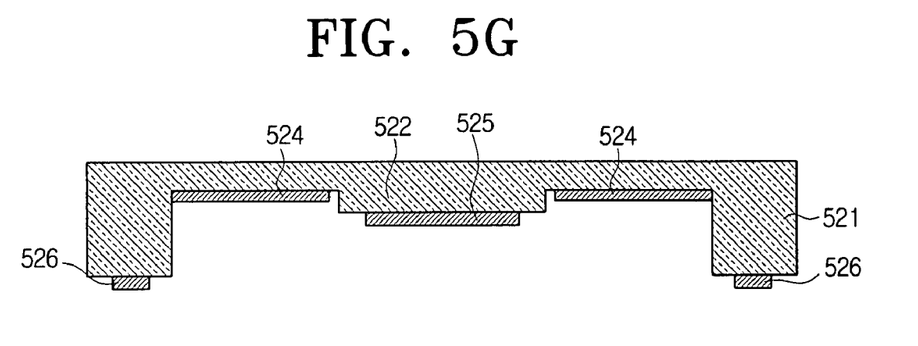

In FIG. 5G, a conductive material is deposited over the second substrate including the first depression and the second depression. Next, by performing and patterning the PR coating (not shown), the first electrode layer 525, the second electrode layer 524, and the second bonding layer 526 are formed. It is preferred that the conductive material is gold (Au). To overcome the steps between the connector 521 and the first depression and the second depression, the PR coating can be executed using a spray coater.

Figure 5H:
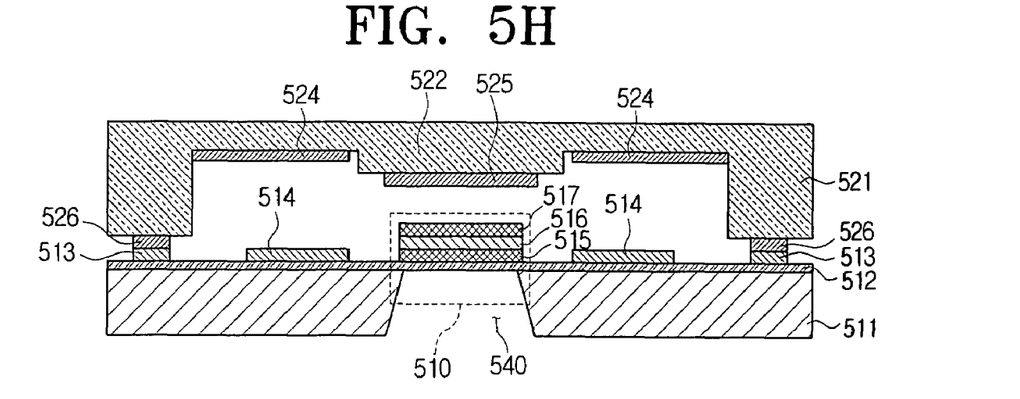

In FIG. 5H, the first substrate 511 and the second substrates 521 and 522 are combined by bonding the first bonding layer 513 on the first substrate 511 with the second bonding layer 526 of the connector 521 on the second substrate.

Figure 5I:
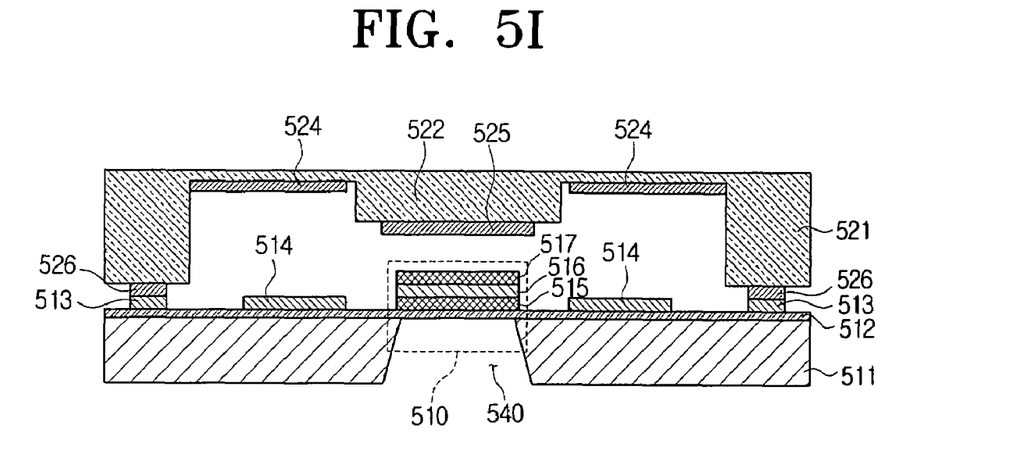

In FIG. 5I, the thickness of the supporter 522 is adjusted by etching the upper surface of the second substrates 521 and 522.

Figure 5J:
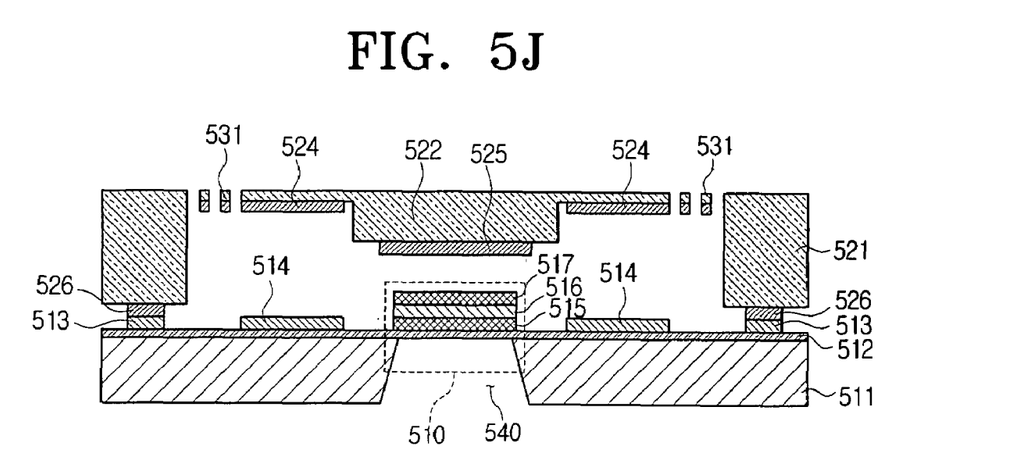
Figure 6:
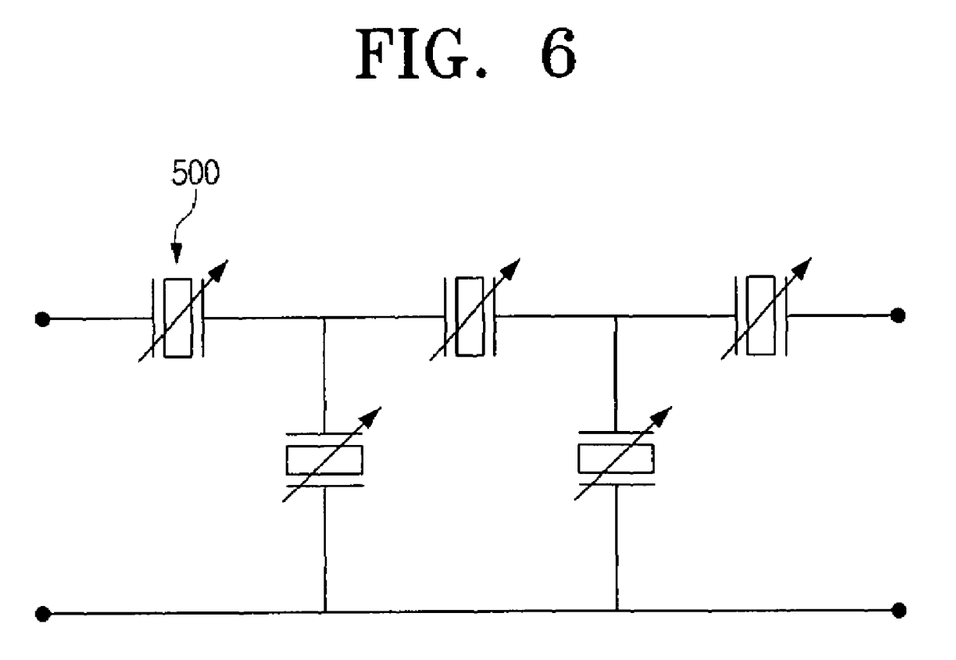
FIG. 6 illustrates a tunable filter which implements the integrated device of FIG. 5 according to an exemplary embodiment of the present invention.

FIG. 5J, the hinge 531 is formed by patterning and etching the upper surface of the second substrates 521 and 522. The upper pattern can be formed as auto track. The hinge 531 can be formed through the selective etching using a reactive ion etching (RIE) method with a reactive gas at ion acceleration. As such, the integrated device 500 can be fabricated with the FBAR and the tunable capacitor integrated together. Using the fabricated integrated devices 500, the tunable filter can be implemented as shown in FIG. 6.

As set forth above, the small integrated tunable FBAR can be fabricated by integrating the FBAR and the tunable capacitor. The integrated device can mitigate the parasitic resistance generating from the discrete connection. In addition, it is possible to increase the tuning range which has been limited to 1.5:1 due to the pull-in effect, by means of the two-gap structure.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An integrated device comprising:
   a substrate;
   a resonator formed on the substrate;
   a driving electrode layer formed on the substrate apart from the resonator;
   a first electrode layer formed upwardly apart from the substrate, facing the resonator, and having an area that corresponds to an area of the resonator; and
   a second electrode layer formed upwardly apart from the substrate, apart from the resonator, and facing the driving electrode layer, the second electrode layer stepped from the first electrode layer, and the second electrode layer is formed so as to not overlap the first electrode layer, wherein the distance between the driving electrode layer and the second electrode layer is greater than the distance between the resonator and the first electrode layer.

2. The integrated device of claim 1, wherein the first electrode layer is movable toward the resonator by a potential difference generated between the second electrode layer and the driving electrode layer.

3. The integrated device of claim 2, wherein the first electrode layer and the second electrode layer are integrally formed, and the first electrode layer is bendable toward the resonator by a potential difference generated between the second electrode layer and the driving electrode layer.

4. The integrated device of claim 1, wherein the second electrode layer is formed above the first electrode layer based on the substrate surface and stepped from the first electrode layer.

5. The integrated device of claim 1, further comprising:
   an upper substrate which supports the first electrode layer and the second electrode layer, and shifts the first electrode layer toward the resonator when a potential difference over a certain magnitude is generated between the second electrode layer and the driving electrode layer.

6. The integrated device of claim 5, wherein the upper substrate comprises:
   a supporter for supporting the first electrode layer and the second electrode layer;
   a connector for connecting with the substrate; and
   a hinge for interconnecting the connector to the support to shake the supporter.

7. The integrated device of claim 6, wherein the supporter comprises a first portion which supports the first electrode layer, and a second portion which is depressed from a surface to support the second electrode layer.

8. The integrated device of claim 5, wherein the driving electrode layer comprises:
   a first driving electrode layer disposed to a first side of the resonator; and
   a second driving electrode layer disposed to second side of the resonator opposite the first side.

9. The integrated device of claim 5, wherein the resonator comprises:
   a cavity formed in the substrate;
   a lower electrode layer formed on the cavity;
   a piezoelectric layer formed on the lower electrode layer; and
   an upper electrode layer formed on the piezoelectric layer.

10. The integrated device of claim 5, wherein a distance h between the first electrode layer and a surface of the resonator is smaller than one third of a distance h2 between the second electrode layer and the driving electrode layer.

* * * * *